(12) United States Patent
Eslambolchi et al.

(10) Patent No.: US 6,873,160 B1
(45) Date of Patent: Mar. 29, 2005

(54) METHOD AND APPARATUS FOR TESTING FILTER/PROTECTOR UNITS FOR FIBER OPTIC CABLES

(75) Inventors: Hossein Eslambolchi, Los Altos Hills, CA (US); John Sinclair Huffman, Conyers, GA (US)

(73) Assignee: AT&T Corp., New York, NY (US)

( * ) Notice: Subject to any disclaimer, the term of this patent is extended or adjusted under 35 U.S.C. 154(b) by 0 days.

(21) Appl. No.: 10/170,651

(22) Filed: Jun. 12, 2002

(51) Int. Cl.[7] .......................... G01R 31/08; H04B 3/46; H01H 31/02
(52) U.S. Cl. .................. 324/523; 324/522; 324/544
(58) Field of Search .............................. 324/522, 523, 324/544

(56) References Cited

U.S. PATENT DOCUMENTS

| | | | | |
|---|---|---|---|---|
| 4,697,096 A | * | 9/1987 | Conrad et al. | 327/540 |
| 5,198,775 A | * | 3/1993 | Bussinger et al. | 324/544 |
| 5,721,662 A | * | 2/1998 | Glaser et al. | 361/119 |
| 6,049,578 A | * | 4/2000 | Senechal et al. | 376/215 |

* cited by examiner

*Primary Examiner*—N. Le
*Assistant Examiner*—John Teresinki

(57) ABSTRACT

Filter/protection units positioned along a fiber optic cable are tested. The fiber optic cable includes a metallic sheath surrounding the cable. A cable locating unit generates an electric signal. The metallic sheath conducts the electrical signal. The electric signal creates a voltage within the metallic sheath. The voltage level is below a specified flashover point or threshold of a normally operating filter/protector unit. As a result, any filter/protector units that are triggered by the electric signal are considered faulty.

6 Claims, 4 Drawing Sheets

METHOD AND APPARATUS FOR TESTING FILTER/PROTECTOR UNITS FOR FIBER OPTIC CABLES

BACKGROUND OF THE INVENTION

1. Field of the Invention

This invention relates to testing. Specifically, the present invention relates to testing fiber optic cables.

2. Description of the Related Art

Most telecommunication companies employ fiber optic cables for the transmission of various types of data and voice communications. Fiber optic cables provide greater bandwidth as compared to conventional copper lines. Additionally, fiber optic cables have a high degree of immunity from interference and cross talk. Oftentimes, fiber optic cables are buried for safety and aesthetics. Since fiber optic cables are commonly buried, it is difficult to locate the buried portion of the fiber optic cable.

In conventional approaches a cable locating system is employed to facilitate locating buried fiber optic cable. The buried fiber optic cable is usually configured with a metallic component (e.g. sheath) running through the length of the cable. The fiber optic cable is manufactured with steel strength members that run throughout the length of the fiber cable. In addition, the cable has a copper/steel clad sheath around the tube that houses the fibers. An electrical signal is generated and conducted through the metallic sheath of the fiber optic cable. The electric signal, which is conducted along the entire length of the fiber optic cable, produces an electromagnetic field and also produces a voltage on the metallic sheath. Technicians operating locating equipment identify the location of the fiber optic cable by detecting the electromagnetic field. For the cable locating system to function properly, the metallic component of the fiber optic cable must remain isolated from the earth. In addition, the metallic component must be grounded on one end and isolated from ground along the cable's entire length.

Since the sheath is a metallic component, the fiber optic cable is susceptible to lightning strikes and induction caused by power lines. Lightning strikes on or near a fiber optic cable can cause significant damage to the cable, reducing or eliminating the operability of the fiber optic cable. In addition, power lines typically generate power in the range of 60 Hz. The 60 Hz signal generated from the power lines create induction, which interferes with the electromagnetic field. To reduce the problems associated with lightning strikes and power line induction, filter/protector units are positioned along the length of the fiber optic cable.

The filter/protector units are installed along the length of the fiber optic cable to minimize the damage caused by lightning strikes and interference from nearby power lines. The filter/protector units serve the dual purpose of reducing or eliminating the 60 Hz signal interference caused by power lines and provide a quick path to ground when lightning strikes the cable. While existing filter/protector units generally provide effective protection against damage from lightning strikes and interference from power lines, if the filter/protector unit is damaged or malfunctions, the cable locating system may be rendered inoperable.

Several problems may result from damaged or defective filter/protector units. With a failed or faulty filter/protector unit, there is limited protection to the fiber optic cable against lightning strikes and induction from power lines. Additionally, if one filter/protector unit fails or malfunctions, the entire locating system for the associated fiber optic cable may be rendered inoperative. Consequently, the detrimental effects of a damaged or malfunctioning filter/protector unit are significant.

Currently, faulty or malfunctioning filter/protector units are determined by excavating the fiber optic cable or waiting for the symptoms of a malfunctioning filter/protector unit to manifest itself during operation. Using conventional methods, locating malfunctioning filter/protector units is time consuming, costly, and results in higher periods of down time. In addition, locating a malfunctioning filter/protector unit during operations is inconvenient for customers. Currently, there is no existing method or apparatus for efficiently testing filter/protector units to ensure that the units are functioning properly, prior to each filter/protector unit's failure.

Thus, there is a need for a method and apparatus that efficiently and effectively troubleshoots filter/protector units prior to failure. There is a need for a method and apparatus that tests and locates filter/protector units prior to failure. Lastly, there is a need for a method and apparatus that provides automated testing of filter/protector units.

SUMMARY OF THE INVENTION

In one embodiment of the present invention an apparatus for testing a filter/protector unit associated with a buried fiber optic cable including a metallic sheath (e.g. conductor) is presented. The apparatus includes an electronic cable locating unit, which applies an electric signal to the metallic sheath. The electrical signal creates a voltage on the metallic sheath. A voltage adjusting module elevates the voltage in the metallic sheath to a level below a threshold voltage level. A malfunctioning filter/protector unit is triggered at the threshold voltage level. A control module monitors the filter protector units and includes logic that determines that a filter/protector unit has been triggered. As a result, an operator is able to detect a malfunctioning filter/protector unit prior to the failure of the filter/protector unit.

In one embodiment of the present invention an apparatus for testing a protector unit associated with a fiber optic cable is presented. The fiber optic cable includes a metallic conductor, the protector unit includes a threshold voltage that triggers the protector unit, the apparatus comprises a voltage adjusting module generating an electric signal that creates a voltage in the metallic conductor. The voltage adjusting module increases the voltage in the metallic conductor; and a control module is coupled to the voltage adjusting module. The control module determines a protector unit has exceeded the threshold voltage in response to the voltage adjusting module increasing the voltage in the metallic conductor.

A method of testing a protector unit coupled to a fiber optic cable is presented. The method comprises the steps of determining a threshold voltage level for triggering the protector unit; applying a test signal to a fiber optic cable, the test signal producing a voltage level below the threshold voltage level; and determining if the protector unit triggered in response to the voltage level below the threshold voltage level.

A system for testing a plurality of protector units associated with a cable is presented. The system comprises a cable including a metallic sheath surrounding the cable; a plurality of protector units each coupled to the cable, each of the plurality of protector units including a threshold voltage; a cable locating unit applying a first electric signal to the metallic sheath at a test voltage level below a threshold voltage level, wherein at least one of the filter protector units is triggered by the test voltage level and the cable locating unit determines each of the plurality of protector units triggered by the test voltage level.

A method of testing a system including a fiber optic cable is presented. The fiber optic cable is coupled to a plurality of protector units, the method comprises the steps of prior to failure of one of the plurality of protector units, generating test signals to test the plurality of protector units; and comparing the test signals to known values of the plurality of protector units, thereby determining that at least one of the plurality of protector units is faulty.

DESCRIPTION OF THE INVENTION

A method and apparatus for testing and locating a faulty filter/protector unit prior to failure or malfunctioning is presented. Initial testing is performed along the length of a fiber optic cable that includes filter protector units attached thereto. The initial testing (e.g. baseline test) is performed by an electronic cable locating unit attached to the filter protector units. The baseline test define the loss across the fiber optic cables and filter protector units when the system is functioning properly. Baseline test information is generated as a result of performing the baseline test. The baseline test information and any computer instruction required to interpret the baseline test information may be located in the electronic cable locating unit or in a processing unit associated with the electronic cable locating unit. Prior to the failure of a filter protector unit, test information is acquired in the electronic cable locating unit. The test information is compared against the baseline test information. Should the disparity between the test information and the baseline test information exceed a threshold, an alarm is raised with a technician or an operator. As such, a faulty filter/protector unit may be identified and located prior to failure.

Figure 1:
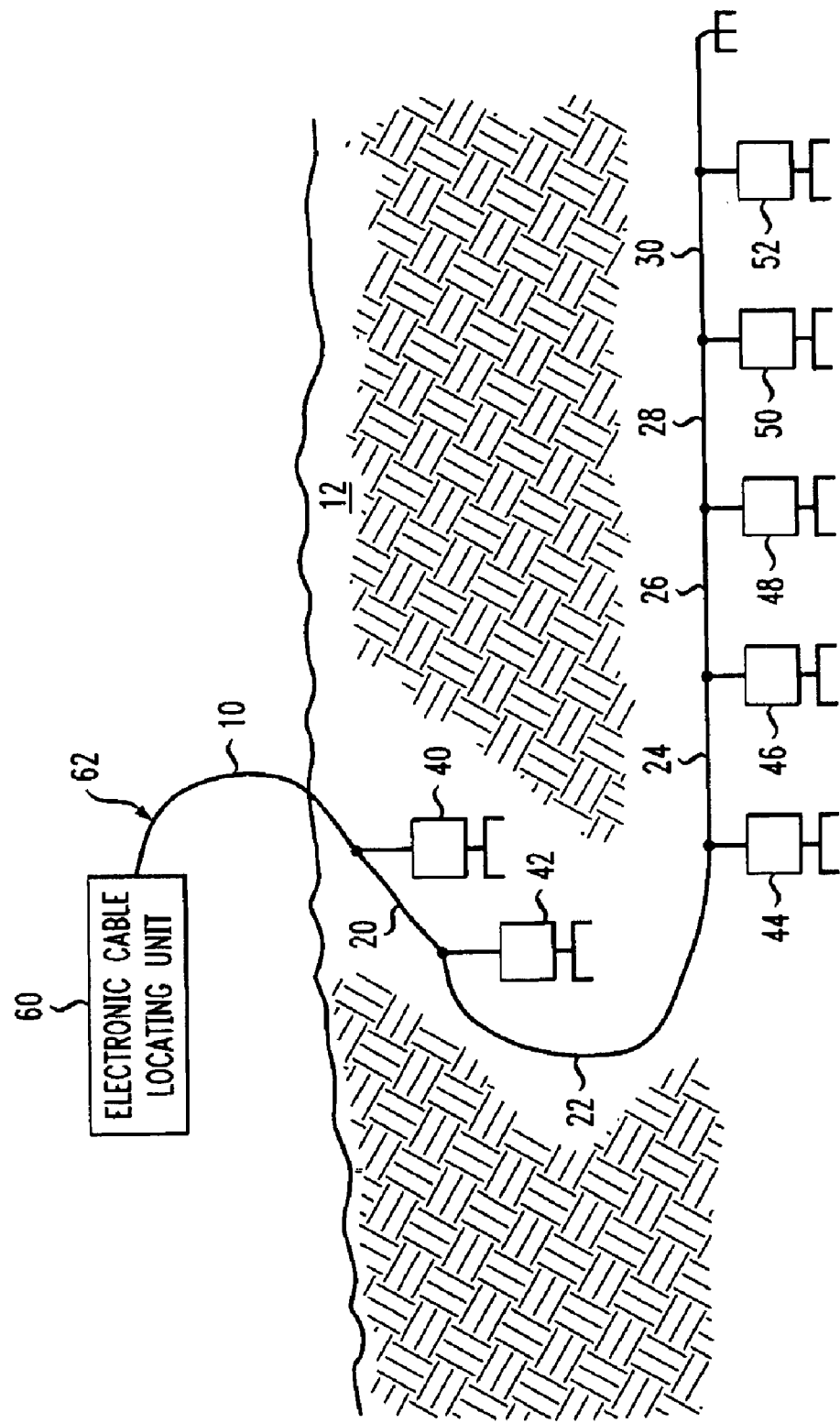
FIG. 1 is a block diagram of a system implementing the method and apparatus of the present invention.

FIG. 1 is a block diagram of a partially buried fiber optic cable 10. A portion of the fiber optic cable is buried in the earth as shown by 12. The fiber optic cable is usually constructed of one or more individual fibers (not shown) surrounded by a metallic sheath (not shown) that extends throughout the length of the fiber optic cable. An electronic cable locating unit 60 is located at an end 62 of the fiber optic cable. An electric signal is generated by the electronic cable locating unit and conducted through the metallic sheath of the fiber optic cable 10.

In one embodiment of the present invention the electronic cable locating system is an oscillator that functions independently of the fiber optic cable. The metallic sheath is electrically connected to the cable locating system by a mechanical connection. As a result, the electronic cable locating system may operate, by conducting an electric signal through the metallic sheath.

The cable 10 includes several individual cable segments 20, 22, 24, 26, 28, and 30 connected at splice points. A filter/protector unit (filter/arrestor) 40, 42, 44, 46, 48, 50, and 52 is positioned at each splice point. The number and location of the filter/protector units is shown for simplicity. The fiber optic cable may utilize any number of filter/protector units at any location along the fiber optic cable.

During initial operations, the cable locating unit is calibrated for a specific length of fiber optic cable. As such, a signal is transmitted on the metallic sheath located in the fiber optic cable 10. As a result of transmitting the electrical signal, a voltage is present in the metallic sheath. The voltage drops off at each filter/protector unit 40, 42, 44, 46, 48, 50 and 52. As such, the electronic cable locating unit or a processor unit associated with the electronic cable location unit is able to calculate the location of each filter/protector unit 40, 42, 44, 46, 48, 50 and 52.

Figure 2:
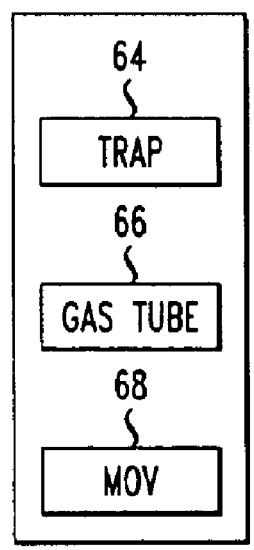
FIG. 2 is a block diagram illustrating several components of a filter/protector unit.

In one embodiment of the present invention, a block diagram illustrating several components of the filter/protector unit is shown as FIG. 2. The filter/protector units include several components. A 60 Hz trap is shown as 64. The 60 HZ trap 64 filters induced power to ground. In addition, a gas tube 66 for connecting the metallic sheath of the cable 10 to ground, when the voltage on the cable exceeds a specified flash over point (e.g. threshold voltage level) is shown. Lastly, a MOV (metal-oxide varistor) is shown as 68.

During operation, a voltage is applied to the metallic sheath in the fiber optic cable. The voltage on the cable is applied below a predefined threshold/flashover point. When the voltage on the fiber optic cable is below the threshold/flashover point, the gas tube is not conductive, thus any signal on the cable remains on the fiber optic cable and does not conduct to ground. If the voltage exceeds the limits (e.g. threshold/flashover point) of the gas tube, the gas tube will immediately provide (e.g. conduct) a path to ground (e.g. function in a shorted state). Therefore any excess signal on the cable will be conducted to ground. The gas tube will stay in the shorted state as long as the excessive signal is on the cable. Once the excess signal level drops below the designated threshold/flashover point, the gas tube will stop conducting a path to ground, and returns to its normal state, which is a nonconductive state. In one embodiment of the present invention, the threshold/flashover point is in the range of 240–300 volts AC RMS.

The filter/protector unit also includes a MOV (metal-oxide varistor). The MOV is an electronic device that conducts to ground and is in parallel with the gas tube. The MOV provides a path for conducting high voltage, such as a lightening strike to ground. The MOV is an electrical component, generally made of zinc oxide, which is used to reduce excess voltage (e.g. a lightening strike). Under normal voltage conditions an MOV has extremely high resistance to current, but above a fixed threshold, the MOV has a change of state and, its resistance to current drops to just above zero. An excess voltage outside the threshold value triggers this change of state. As a result, when excess voltage impacts the fiber optic cable, most of the current is conducted through the MOV and away from any protected circuitry. Once the excess voltage condition is removed, the MOV then returns to a highly resistant state.

The filter/protector units perform several functions. Each of the filter/protector units effectively shunts lightning and other unnecessary voltages to ground. The filter/protector unit is triggered by exceeding a specified flash over point or threshold level (e.g. 240 volts AC RMS). Once the filter/protector unit has been triggered, the filter/protector unit conducts any electricity caused by the triggering event (e.g.

lightening, excess voltage), to ground. The MOV and the Gas Tube are implemented with predefined thresholds for conducting electricity. As a result, the filter/protector units are triggered at predetermined threshold levels.

As fiber cables are designed and routed, a fiber engineer selects the MOV and Gas Tubes and defines a required threshold for a specific route. For example 240 Volts RMS is a typical threshold voltage. If the total voltage on the fiber cable is below the threshold (e.g. flashover point) the components of the electronic filter/protection unit are not conductive and do not provide a path to ground. If the threshold is exceeded, the components of the electronic filter/protection unit become conductive and provide a path to ground. The components of the electronic filter/protection unit remain in the conductive state as long as the voltage is above the threshold/flashover point. Once the voltage drops below the threshold/flashover points then the MOV and the Gas Tube located in the electronic filter/protection unit return back to their normal state.

Figure 3:
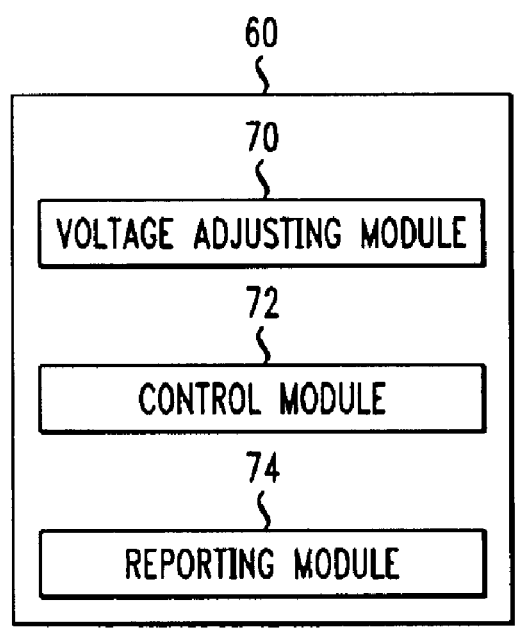
FIG. 3 is a block diagram illustrating components of an electronic cable locating unit.

FIG. 3 is a block diagram illustrating components of the electronic cable locating unit 60 shown in FIG. 1. The electronic cable locating unit 60 includes a voltage adjusting module 70 for automatically increasing the operating voltage on the metallic sheath in the fiber optic cable to a level just below a specified threshold/flashover point of the filter/protector unit. The electronic cable locating unit begins operation with a voltage that is consistent with the normal operating power for the specific fiber optic cable that the electronic cable locating unit is connected to. The voltage level is then increased until it is below the preset limits of the MOV and Gas Tubes for the specific fiber route. Additionally, the electronic cable locating unit 60, includes a control module 72 for controlling the operation and testing of the filter/protector units and a reporting module 74 for providing status/report information on the filter/protector unit to a technician.

With reference to FIGS. 1–3, the testing of the filter/protector units will now be discussed. In accordance with the teachings of the present invention, a method is presented for testing filter/protector units along a length of buried fiber optic cable. Several filter/protector units are positioned along the length of the fiber optic cable 10 between each cable segment 20, 22, 24, 26, 28, and 30. As discussed above a filter/protector unit is triggered by exceeding a specified threshold voltage level or flashover point (e.g. 240 volts AC RMS). When triggered, the filter/protector unit conducts electrical signals to ground.

A damaged or malfunctioning filter/protector unit has a modified flashover point below the originally specified flashover point or threshold of a filter/protector unit without faults. The control module 72 generates signals that cause the voltage adjusting module 70 to incrementally increase the voltage level on the metallic sheath. The control module then monitors the filter/protector units. A signal is applied to the metallic sheath in the fiber optic cable, the voltage drops along the length of the cable. As a result, the logic associated with an electronic cable locating unit is used to calculate the normal (e.g. expected) voltage drop in a predetermined length of fiber optic cable.

In addition, the electronic cable locating unit measures the voltage just below the point that the filter/protector unit goes into a conductive state (e.g. flash over point) and the voltage just after the filter/protector unit is in its conductive state. Using these two measurements, the electronic cable locating unit can determine the location of the filter/protector unit by comparing the two levels of voltage. Since, the electronic cable locating unit has calculated the normal voltage drop in a predetermined length of fiber optic cable; the location of the defective unit may be determined by comparing the flashover point to the normal operating level of the filter/protector unit at various locations. If a filter/protector unit is triggered by a voltage level below a threshold voltage level, the control module communicates the detected fault to the reporting module 74. The reporting module 74 may then store or send an alarm, a report, or other alert. However, if none of the filter/protector units are triggered, the voltage adjusting module incrementally increases the voltage on the metallic sheath. On each incremental increase in the voltage, the control module monitors the metallic sheath. It the control module detects a failed filter/protector unit the reporting module logs the detected fault. Subsequently, the reporting module may store, send, or report an alarm to an operator.

Once a defective unit is discovered, an alarm is generated via the electronic cable locating unit. The alarm may be sent to an office alarm system and technicians will be dispatched to address the problem. The reporting module 74 may report a defective filter/protector unit to an operator/technician when they arrive to inspect the electronic locating unit or the report may be communicated to the operator/technician at their office location.

A report may be presented by the reporting module in any manner, such a's in a computer tabular display or printout. The report may be stored for retrieval by a technician or sent via a communications line (not shown) to a remote control center. By determining the specific filter/protector units that is damaged or is malfunctioning, the filter/protector units may be repaired or replaced prior to failure or degradation of the filter/protector units. In addition, testing of the filter/protector units may be periodically conducted at a specific time, such as on a daily or hourly basis.

Figure 4:
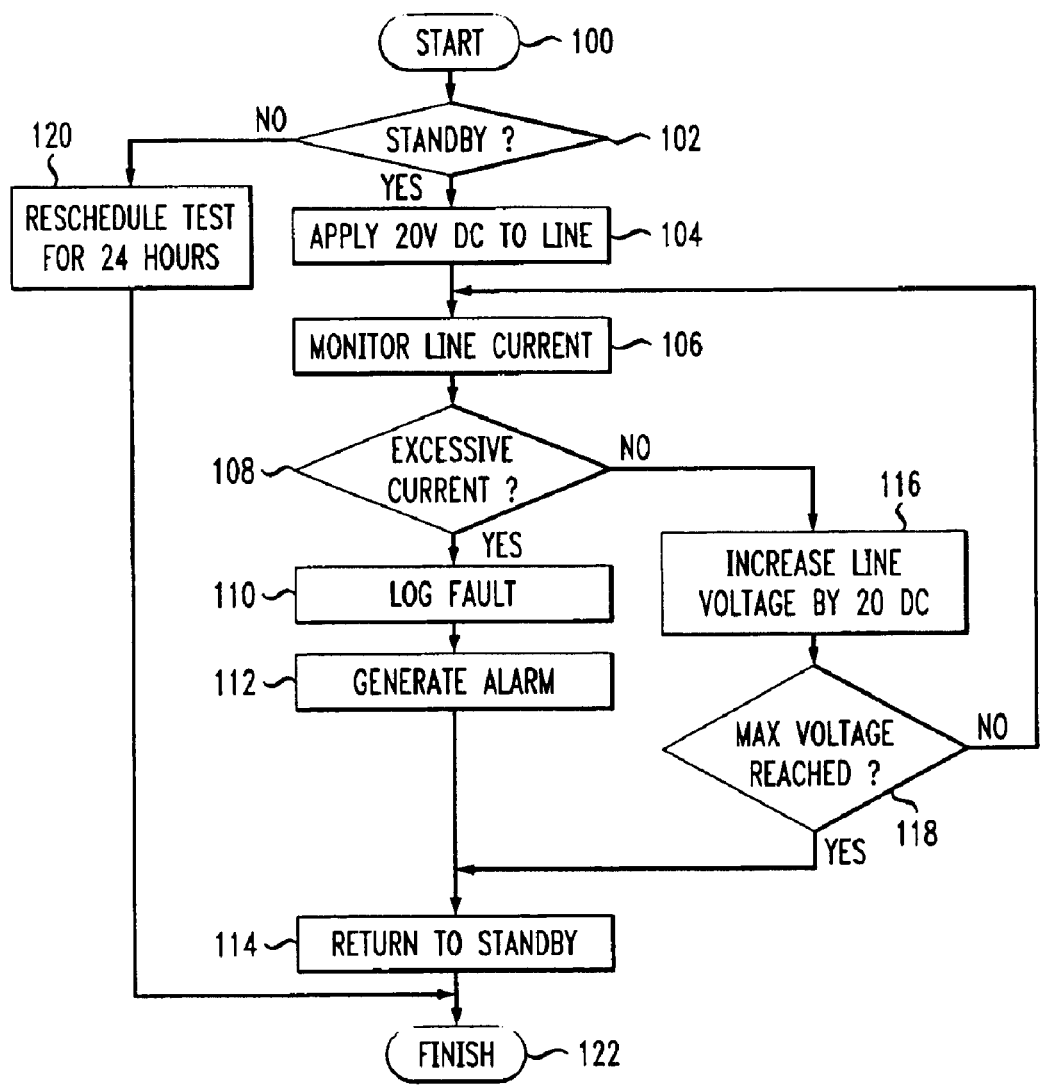
FIG. 4 is a flow chart illustrating a method of the present invention.

FIG. 4 is a flow chart illustrating the steps of testing and detecting faulty filter/protector units according to the teachings of the present invention. With reference to FIGS. 1–4, the method of testing and detecting faulty filter/protector units will now be discussed. The system starts as shown by 100. A test is made to determine if the electronic cable locating unit is in standby mode as shown by 102. If the electronic cable locating unit is not in standby mode as shown by 102, the test is rescheduled for a period of time such as 24 hours as shown by 120. If the electronic cable locating unit is in standby mode, voltage is applied to the metallic sheath as shown by 104. For example, 20 volts DC may be applied to the metallic sheath. The line current (e.g. metallic sheath) is then monitored as shown by 106. If there is excess current on the metallic sheath as shown by 108 a fault is logged as shown by 110. After a fault is logged, an alarm is generated as shown by 112. Once the alarm is generated the system returns to standby mode as shown by 114. If there is no excess current as shown by 108, the line voltage is incrementally increased as shown by 116. For example, the line voltage is incrementally increased by 2.0 volts. Once the line voltage has been increased, the metallic sheath is tested to determine if a threshold voltage has been reached as shown by 118. If a threshold voltage has not been reached, the system loops back to monitoring the line current as shown by 106. If the threshold voltage has been reached the system returns to standby as shown by 114.

Figure 5:
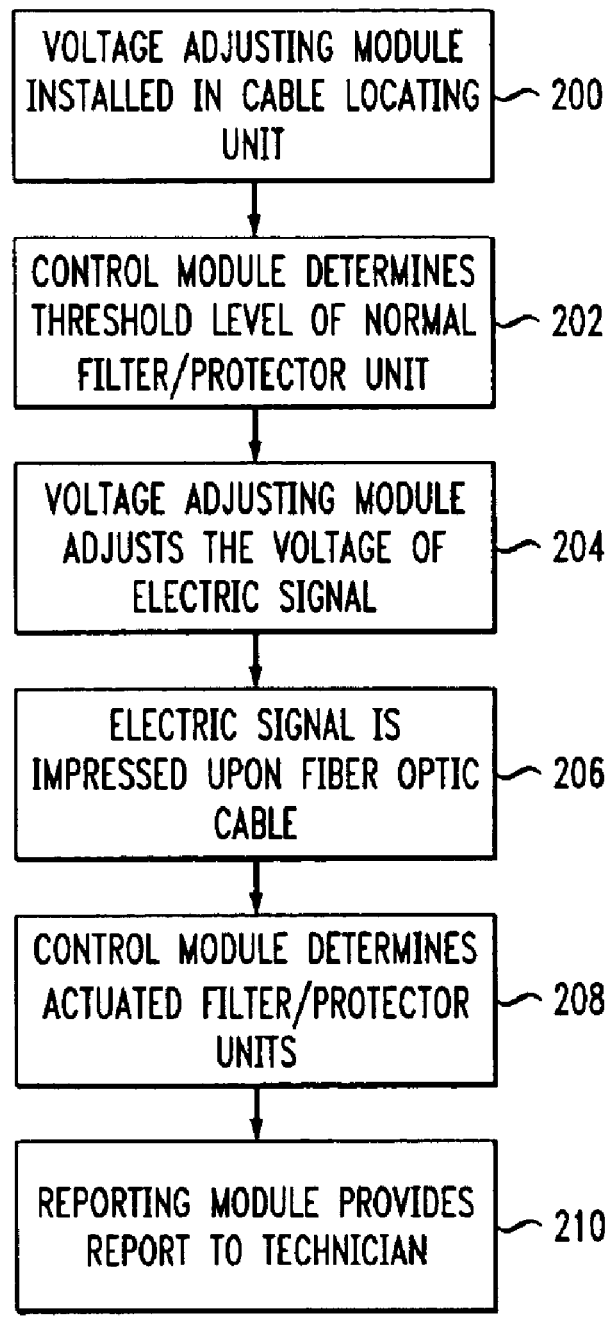
FIG. 5 is a flow chart illustrating an embodiment of the present invention.

FIG. 5 is a flow chart illustrating an embodiment of the present invention. With reference to FIGS. 1–4 and 5, the method of testing and detecting faulty filter/protector units will now be discussed. First, in step 200, a voltage adjusting module 70 is installed within the electronic cable locating unit 60 to adjust the voltage applied to a metallic sheath located in the fiber optic cable 10. At step 202, the control module 72 determines the flash over point or threshold level of a normally functioning filter/protector unit. This threshold value may be automatically determined by the electronic cable locating unit or, may be provided as an external input, from a technician. In step 204, the voltage-adjusting module adjusts the voltage to a level slightly below the specified flash over point or threshold of the filter/protector units. The method then moves to step 206 where the electrical signal is applied to the metallic sheath. In step 208, the control module 72 determines each filter/protector unit that has been triggered. At step 210, the reporting module 74 reports to the technician, the filter/protector units that triggered below the threshold level. Although the voltage adjusting module 70, control module 72, and reporting module 74 are displayed within the electronic cable locating unit 60, in alternate embodiments of the present invention, the modules may be located remotely and directly connected or connected via a network connection to the electronic cable locating unit.

The present invention is an efficient and effective method of testing and determining the operability of a filter/protector unit. Specifically, a faulty or damaged filter/protector unit may be determined prior to the unit failing. Efficient detection and repair of faulty filter/protector units, without extensive excavation, reduces the time and cost of replacing the defective filter/protector units.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

What is claimed is:

1. An apparatus for testing a protector unit associated with a fiber optic cable, the fiber optic cable including a metallic conductor, the protector unit including a threshold voltage that triggers the protector unit to ground the metallic conductor, the apparatus comprising:

a voltage adjusting module generating an electric signal that creates a voltage in the metallic conductor, the voltage adjusting module increasing the voltage in the metallic conductor; and a control module coupled to the voltage adjusting module, the control module determining a protector unit has triggered to ground the metallic conductor in response to the voltage adjusting module increasing the voltage in the metallic conductor.

2. An apparatus for testing the protector unit as claimed in claim 1, wherein the voltage adjusting module and the control module reside within an electronic cable locating unit.

3. An apparatus for testing the protector unit as claimed in claim 1, wherein a triggered protector unit indicates a malfunctioning protector unit.

4. An apparatus for testing a protector unit as claimed in claim 3, further comprising a reporting module for reporting a malfunctioning protector unit.

5. An apparatus for testing a protector unit as claimed in claim 1, wherein the threshold voltage is between 200 and 300 volts.

6. An apparatus for testing a protector unit as claimed in claim 1, wherein the voltage adjusting module emits a second electric signal for locating a protector unit.

* * * * *